(12) United States Patent
Nagayama

(10) Patent No.: US 7,573,314 B2
(45) Date of Patent: Aug. 11, 2009

(54) LEVEL SHIFT CIRCUIT

(75) Inventor: Atsushi Nagayama, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/140,553

(22) Filed: Jun. 17, 2008

(65) Prior Publication Data

US 2009/0027101 A1 Jan. 29, 2009

(30) Foreign Application Priority Data

Jul. 23, 2007 (JP) ............................. 2007-191184

(51) Int. Cl.
H03L 5/00 (2006.01)
(52) U.S. Cl. ............................. 327/333; 326/63; 326/81
(58) Field of Classification Search ............. 326/62–63, 326/80–81; 327/306, 333
See application file for complete search history.

(56) References Cited

U.S. PATENT DOCUMENTS 6,504,400 B2 * 1/2003 Tanaka et al. .................. 326/68
7,196,547 B2 * 3/2007 Kozawa ........................ 326/81

FOREIGN PATENT DOCUMENTS

JP 2006173889 6/2006

* cited by examiner

Primary Examiner—Dinh T. Le
(74) Attorney, Agent, or Firm—Studebaker & Brackett PC; Donald R. Studebaker

(57) ABSTRACT

The present invention provides a level shift circuit that can reliably cut off the path of a through current regardless of the state of supply of power to plural circuit sections that operate by different power supplies. The level shift circuit is provided with an input circuit section that operates by a power supply voltage VDD1 and an output circuit section that operates by a power supply voltage VDD2. An inverter circuit, which operates by the power supply voltage VDD1 and converts a control signal that is inputted from the output circuit section, is disposed in the input circuit section. The output of the inverter circuit is used as the output of another inverter circuit that operates by the power supply voltage VDD2 of the output circuit section and as the control signal of the input circuit section.

5 Claims, 4 Drawing Sheets

LEVEL SHIFT CIRCUIT

CROSS-REFERENCE TO RELATED APPLICATION

This application claims priority under 35 USC 119 from Japanese Patent Application No. 2007-191184, the disclosure of which is incorporated by reference herein.

BACKGROUND OF THE INVENTION

1. Field of the Invention

The present invention relates to a level shift circuit that is provided with plural circuit sections that operate by different power supplies and which performs signal transmission between the circuit sections.

2. Description of the Related Art

Conventionally, in control chips and the like of a configuration that uses plural power supplies of different power supply voltages to cause circuits to operate, a level shift circuit has been used when performing signal transmission between the circuits that are operated by the different power supply voltages.

This type of level shift circuit operates normally in a state where electrical power of each of the power supply voltages is being supplied. However, when any of the supplies of electrical power is cut off, sometimes a through current flows and output becomes indefinite. When used for the purpose of operating by a battery, this through current lowers the life of the battery.

For example, in Japanese Patent Application Publication (JP-A) No. 2006-173889, as shown in FIG. 4, there is disclosed a level shift circuit 100 that is configured by an input circuit 101 that operates by a power supply voltage VDD1 and an output circuit 102 that operates by a power supply voltage VDD2. This level shift circuit 100 is provided with a NAND gate circuit 105, to which a control signal PD that is inputted from a control circuit (not shown) is inputted after being inverted by an inverter circuit 106 and which fixes the output level of the output circuit 102, and NOR gate circuits 103 and 104, to which an inverted signal of this control signal PD is inputted after being further inverted by an inverter circuit 107 and which fix the output level of the input circuit 101.

In the level shift circuit 100 that has been configured in this manner, when the power supply voltage VDD1 of the input circuit 101 has been cut off, the control circuit that causes the output circuit 102 to operate outputs an H level signal as the control signal PD.

Thus, in the output circuit 102, the control signal PD that has been inverted by the inverter circuit 106 is inputted to the NAND gate circuit 105 of the output circuit 102, and the output level of the output circuit 102 is fixed.

On the other hand, in the input circuit 101, the control signal PD that has been inverted by the inverter circuit 106 is further inverted by the inverter circuit 107 and is inputted to the NOR gate circuits 103 and 104 of the input circuit 101, and the output level of the input circuit 101 is fixed to an L level. As a result, N1 and N2 of the output circuit 102 becomes OFF.

By performing control in this manner, the level shift circuit 100 can cut off the path of a through current.

However, in the level shift circuit disclosed in JP-A No. 2006-173889, when supply of electrical power of the power supply voltage VDD2 is cut off in a state where electrical power of the power supply voltage VDD1 has been supplied, the output of the inverter circuit 107 in the output circuit 102 becomes indefinite. Moreover, the control signal PD is not transmitted to the input circuit 101, so a through current ends up flowing to the NOR gate circuits 103 and 104 of the input circuit 101.

Here, it is also possible to prevent a through current from flowing by first starting the power supply of the power supply voltage VDD2 when starting the power supplies and stopping the power supply voltage VDD2 last when stopping the power supplies. However, in an IC that is provided with plural circuit sections that are operated by different power supplies and that perform reciprocal signal exchanges therebetween, controlling the order of starting and stopping of the power supplies to prevent the creation of a through current path ends up becoming complicated.

The present invention provides a level shift circuit that can reliably cut off the path of a through current regardless of the state of the supply of power supplies to plural circuit sections that operate by different power supplies.

SUMMARY OF THE INVENTION

A first aspect of the invention is a level shift circuit including: an input circuit section that operates by the supply of electrical power from a first power supply voltage; an output circuit section, electrically connected to the input circuit section, that operates by the supply of electrical power from a second power supply voltage different from the first power supply voltage; a level converter circuit, disposed in the output circuit section, including an N-channel first transistor and an N-channel second transistor having grounded sources; a P-channel third transistor having a source connected to a power supply line of the second power supply voltage, a drain connected to the drain of the first transistor, and a gate connected to the drain of the second transistor; and a fourth transistor having a source connected to a power supply line of the second power supply voltage, a drain connected to the drain of the second transistor, and a gate connected to the drain of the first transistor; a first converter circuit that operates by the supply of electrical power from the second power supply voltage and converts and outputs a power supply cut off control signal inputted from the outside of the output circuit section; a second converter circuit that operates by the supply of electrical power from the second power supply voltage and converts and outputs a signal inputted from the first converter circuit; a third converter circuit that operates by the supply of electrical power from the first power supply voltage and converts and outputs a signal inputted from the first converter circuit; a fixing circuit, disposed in the output circuit section, that fixes a signal level to be outputted from the output circuit section, based on the output from the level converter circuit and a control signal outputted from the second converter circuit; a first generator circuit, disposed in the input circuit section, that generates a control signal to be outputted to the gate of the first transistor, based on an input signal inputted from outside of the input circuit section, the signal outputted from the second converter circuit and the signal outputted from the third converter circuit; and a second generator circuit, disposed in the input circuit section, that generates a control signal to be outputted to the gate of the second transistor, based on the signal generated by the first generator circuit, the signal outputted from the second converter circuit and the signal outputted from the third converter circuit.

In the preceding aspect, the output of the third converter circuit may be further inputted to the fixing circuit, and the fixing circuit may fix the signal level outputted from the output circuit section, based on the output resulting from the level converter circuit, the output resulting from the second converter circuit and the output resulting from the third converter circuit.

Further, in the preceding aspect, the level shift circuit may further include an N-channel fifth transistor having a drain connected to the output of the fixing circuit, a grounded source and a gate connected to the output of the third converter circuit.

A second aspect of the invention is a level shift circuit including: a first power supply region including a plurality of circuit sections that operate by the supply of electrical power having a first power supply voltage; a second power supply region including a circuit section electrically connected to the circuit sections disposed in the first power supply region, wherein the second power supply region operates by the supply of electrical power having a second power supply voltage different from the first power supply voltage; a first converter circuit section, disposed in the second power supply region, that performs a predetermined conversion on a power supply cut off control signal inputted from the outside of the level shift circuit, and outputs the converted signal; a second converter circuit section, disposed in the second power supply region, that performs conversion on a signal outputted by the first converter section, and outputs the converted signal, the conversion thereof being opposite to the conversion of the first converter circuit section; a third converter circuit section, disposed in the first power supply region, that performs conversion on a signal outputted by the first converter section, and outputs the converted signal, the conversion thereof being opposite to the conversion of the first converter circuit section; a level converter circuit section, disposed in the second power supply region, that performs level conversion in response to a signal inputted via the first power supply region; a generator circuit section, disposed in the first power supply region, that generates a signal to be outputted to the level converter circuit section, based on an input signal inputted from the outside of the level shift circuit, the signal outputted from the second converter circuit section and the signal outputted from the third converter circuit section; and a fixing circuit section, disposed in the second power supply region, that fixes the output resulting from the level converter circuit section, based on the signal outputted from the second converter circuit section.

In the preceding aspect, the level shift circuit may further include an auxiliary fixing circuit section that further fixes the output resulting from the fixing circuit section, based on the signal outputted from the third converter circuit section.

According to the above-described aspects, the present invention reliably cuts off the path of a through current regardless of the power supply states of different power supplies to plural circuit sections that are operated by the different power supplies.

BRIEF DESCRIPTION OF THE DRAWINGS

Exemplary embodiments of the present invention will be described in detail based on the following figures, wherein.

DETAILED DESCRIPTION OF THE INVENTION

Below, embodiments of the present invention will be described in detail with reference to the drawings.

First Embodiment

Figure 1:
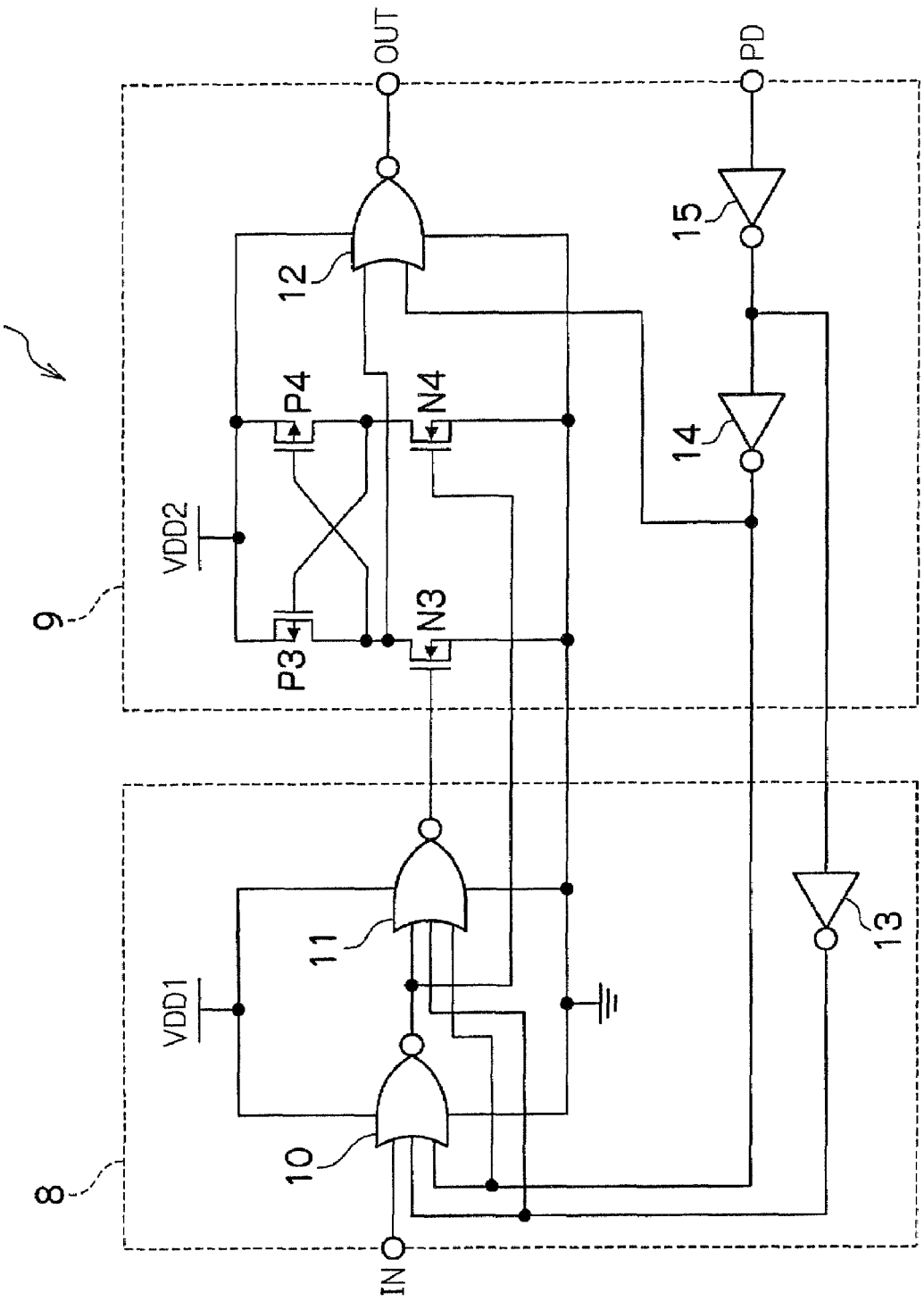
FIG. 1 is a diagram showing the configuration of a level shift circuit pertaining to a first embodiment.

FIG. 1 shows a level shift circuit 1 according to a first embodiment.

As shown in FIG. 1, the level shift circuit 1 according to the first embodiment is configured to include an input circuit section 8 that operates by a power supply voltage VDD1 and an output circuit section 9 that operates by a power supply voltage VDD2.

The input circuit section 8 is configured to include two NOR circuits 10 and 11. Moreover, an inverter circuit 13, which uses a power supply cut off control signal that is outputted from an inverter circuit 15 of the later-described output circuit section 9 as input, is disposed in the input circuit section 8.

Further, an input terminal IN of the input circuit section 8 is connected to a first control circuit (not shown) that operates by the power supply voltage VDD1, and a control signal IN is inputted from the first control circuit. An output terminal of the input circuit section 8 is connected to the output circuit section 9.

The control signal IN is inputted to an input end of the NOR gate circuit 10, and an output end of the inverter circuit 13 and an output end of an inverter circuit 14 of the output circuit section 9 are connected to input ends of the NOR gate circuit 10. Further, an output end of the NOR gate circuit 10, the output end of the inverter circuit 13 and the output end of the inverter circuit 14 of the output circuit section 9 are connected to input ends of the NOR gate circuit 11.

The output circuit section 9 is configured to include NMOS transistors N3 and N4, PMOS transistors P3 and P4, the two inverter circuits 14 and 15, and a NOR gate circuit 12.

Further, a control terminal PD of the output circuit section 9 is connected to a second control circuit (not shown) that operates by a power supply different from the power supplies that supply the power supply voltages VDD1 and VDD2 and with respect to which power supply cut off is not performed (however, if it is a circuit on the same LSI as the input circuit section 8 and the output circuit section 9, a power supply voltage VDD3). A control signal PD is inputted from the second control circuit.

The control terminal PD is connected to an input end of the inverter circuit 15, and the power supply cut off control signal PD that has been inputted from the second control circuit is inputted to the input end of the inverter circuit 15. The inverter circuit 15 inverts and outputs the control signal PD that has been inputted.

Further, an output end of the inverter circuit 15 is connected to an input end of the inverter circuit 14. The inverter circuit 14 further inverts and outputs the control signal PD that has been inverted by the inverter circuit 15.

The sources of the NMOS transistors N3 and N4 are grounded. The output end of the NOR gate circuit 10 of the input circuit section 8 is connected to the gate of the NMOS transistor N3. An output end of the NOR gate circuit 11 of the input circuit section 8 is connected to the gate of the NMOS transistor N4.

Further, the PMOS transistors P3 and P4 use the power supply voltage VDD2 as their sources. The drain of the NMOS transistor N4 is connected to the gate of the PMOS transistor P3. The drain of the NMOS transistor N3 is connected to the gate of the PMOS transistor P4.

The drain of the PMOS transistor P4 and the drain of the NMOS transistor N4 are interconnected. Moreover, the source of the NMOS transistor N3 and the drain of the PMOS transistor P3 are interconnected.

The NOR gate circuit 12 is connected to the drain of the PMOS transistor P3 and the output end of the inverter circuit 14. An output end of the NOR gate circuit 12 is connected to an output terminal OUT.

Next, the action of the first embodiment will be described.

First, a case will be described where the power supplies of both of the power supply voltage VDD1 and the power supply voltage VDD2 have started and H level signals have been inputted to the control terminals PD and IN.

The signal that has been inputted to the control terminal PD is inverted by the inverter circuit 15 of the output circuit section 9, is further inverted by the inverter circuit 14, and becomes the same H level as the control terminal PD. Moreover, the output of the inverter circuit 15 becomes the same H level as the control terminal PD by the inverter circuit 13 of the input circuit section 8.

For this reason, an H level is inputted from the inverter circuit 13 to the NOR gate circuits 10 and 11 of the input circuit section 8, so the output signals of these NOR gate circuits 10 and 11 become an L level regardless of the input signal level of the input terminal IN. Because of this L level output signal, the NMOS transistors N3 and N4 of the output circuit section 9 become OFF and cuts off the through current paths.

Further, an H level signal is inputted by the inverter circuit 14 to the NOR gate circuit 12 of the output circuit section 9, so the output signal of the NOR gate circuit 12 becomes an L level regardless of the signal level of the other input end.

As a result, when both of the power supplies have started and the control terminal PD is an H level, all through current paths inside the level shift circuit 1 become cut off.

Here, when supply of the power supply voltage VDD1 is cut off, the signal from the output circuit section 9 is inputted, so the L level is held in the NOR gate circuits 10 and 11 of the input circuit section 8.

As a result, even when supply of the power supply voltage VDD1 has been cut off, all of the through current paths inside the level shift circuit 1 are held in a state where they are cut off.

Further, when supply of the power supply voltage VDD2 is cut off from a state where the power supplies of both of the power supply voltages VDD1 and VDD2 are being supplied, the output of the inverter circuit 15 of the output circuit section 9 holds an L level. At this time, an H level is held in the output of the inverter circuit 13 of the input circuit section 8, so an L level is held in the outputs of the NOR gate circuits 10 and 11 of the input circuit section 8.

As a result, even when supply of the power supply voltage VDD2 has been cut off, all of the through current paths inside the level shift circuit 1 are held in a state where they are cut off.

It will be noted that, here, a case has been described where H level signals have been inputted to both the control terminal PD and the input terminal IN. However, as mentioned above, the output signal levels of the NOR gate circuits 10, 11 and 12 become an operation that is not dependent on the signal level of the input terminal IN. For this reason, even when the control terminal PD is an H level and the input terminal IN is an L level, operation becomes the same.

Next, a case will be described where the power supplies of the power supply voltages VDD1 and VDD2 have started, an L level signal has been inputted to the control terminal PD and an H level signal has been inputted to the input terminal IN.

In this case, the output signal of the inverter circuit 15 of the output circuit section 9 becomes an H level and is inputted to the inverter circuit 13 of the input circuit section 8. Consequently, the output signal of the inverter circuit 13 becomes an L level.

As a result, the NOR gate circuits 10 and 11 of the input circuit section 8 become an inverted operation because two inputs of their three inputs become an L level. The H level signal that has been inputted to the input terminal IN becomes an L level in the output of the NOR gate circuit 10 of the input circuit section 8 and becomes an H level in the output of the NOR gate circuit 11.

Thus, in the output circuit section 9, the NMOS transistor N4 becomes OFF and the NMOS transistor N3 becomes ON. Consequently, the PMOS transistor P3 moves to OFF and the PMOS transistor P4 moves to ON. Thus, an L level signal is inputted to one input end of the NOR gate circuit 12.

Further, an L level output signal is inputted from the inverter circuit 14 to the other input end of the NOR gate circuit 12. Consequently, the NOR gate circuit 12 inversely operates similar to the NOR gate circuits 10 and 11 of the input circuit section 8, and an H level is outputted to the output terminal OUT.

On the other hand, when an L level has been inputted to the input terminal IN, the outputs of the NOR gate circuits 10 and 11 of the input circuit section 8 become an H level and an L level, respectively. Thus, in the output circuit section 9, the NMOS transistor N3 becomes OFF and the NMOS transistor N4 becomes ON. Thus, the PMOS transistor P4 moves to OFF and the PMOS transistor P3 moves to ON. An H level is inputted to one input end of the NOR gate circuit 12, and an L level is inputted to the output terminal OUT.

That is, when an H level has been inputted to the control terminal PD, the output terminal OUT becomes an L level regardless of the input level of the input terminal IN. Further, when an L level has been inputted to the control terminal PD, the signal having a signal amplitude of VDD1 that has been inputted to the input terminal IN is outputted to the output terminal OUT with the same logic as the inputted signal having a signal amplitude of VDD2.

As described above, according to the first embodiment, the level shift circuit is provided with the input circuit section 8 that operates by the power supply voltage VDD1, and the output circuit section 9 that operates by the power supply voltage VDD2, and the inverter circuit 13 is disposed in the input circuit section 8 and operates by the power supply voltage VDD1 and converts the control signal that is inputted from the output circuit section 9. The output of the inverter circuit 13 and the output of the inverter circuit 14 that operates by the power supply voltage VDD2 of the output circuit section 9 are used as the control signal, thus obtaining the effect of preventing the creation of a through current path when an H level has been inputted to the control terminal PD, even when the power supply to either VDD1 or VDD2 is cut off.

Second Embodiment

In the preceding first embodiment, an embodiment has been described where an inverter circuit is disposed in the input circuit section 8 to ensure that a through current path is not formed. In a second embodiment, an embodiment will be described where the output from the output terminal OUT when supply of the power supply of either of the power supply voltages has been cut off is fixed to an L level.

Figure 2:
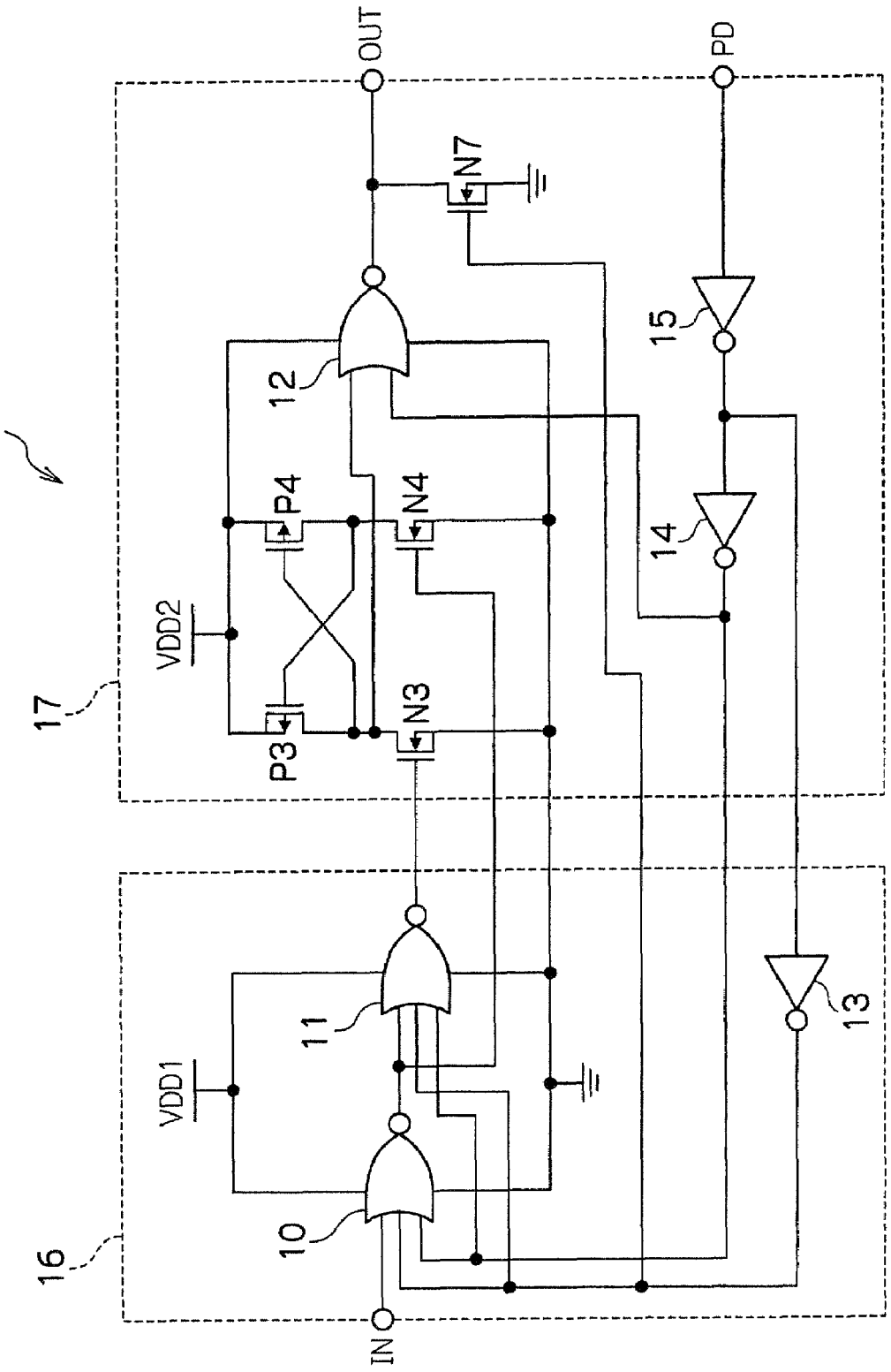
FIG. 2 is a diagram showing the configuration of a level shift circuit pertaining to a second embodiment.

FIG. 2 shows a level shift circuit 2 pertaining to the second embodiment. It will be noted that, in FIG. 2, the same reference numerals are given to portions that are the same as those in the configuration of the level shift circuit 1 pertaining to the preceding first embodiment and that description here will be omitted.

As shown in FIG. 2, in the second embodiment, an NMOS transistor N7 is further disposed in an output circuit section 17. The drain of the NMOS transistor N7 is connected to the output terminal OUT of the output circuit section 17, the gate of the NMOS transistor N7 is connected to the output end of the inverter circuit 13 of an input circuit section 16 that operates by the power supply voltage VDD1, and the source of the NMOS transistor N7 is grounded.

According to the level shift circuit 2 that has been configured in this manner, when the power supply of VDD2 is cut off from a state where an H level signal is inputted to the control terminal PD and the power supply voltages VDD1 and VDD2 are being supplied, both of the inputs of the NOR gate circuit 12 of the output circuit section 17 become indefinite, and the output of the NOR gate circuit 12 also becomes indefinite.

At this time, an H level is outputted from the inverter circuit 13 of the input circuit section 16 that operates by the power supply voltage VDD1, so the NMOS transistor N7 becomes ON and an L level is outputted to the output terminal OUT.

As described above, according to the second embodiment, by adding the NMOS transistor N7, the output terminal OUT can be fixed to an L level even when the power supply of either VDD1 or VDD2 is cut off.

It will be noted that, in the second embodiment, an embodiment has been described where the circuit that is connected to the output terminal OUT is configured using the two-input NOR gate circuit 12 and the NMOS transistor N7. However, the present invention is not limited to this. The circuit that is connected to the output terminal OUT can also be made into a three-input NOR gate circuit by combining the two inputs inputted to the NOR gate circuit 12 and the drain of the NMOS transistor N7.

Further, in each of the preceding embodiments, embodiments have been described where an inverter gate circuit is used for signal transmission from the control terminal PD. However, the present invention is not limited to this, and it suffices as long as the same logic as each of the preceding embodiments can be configured. For example, the same logic can be configured by appropriately combining and using gates circuits such as NAND gate circuits and NOR gate circuits.

Figure 3:
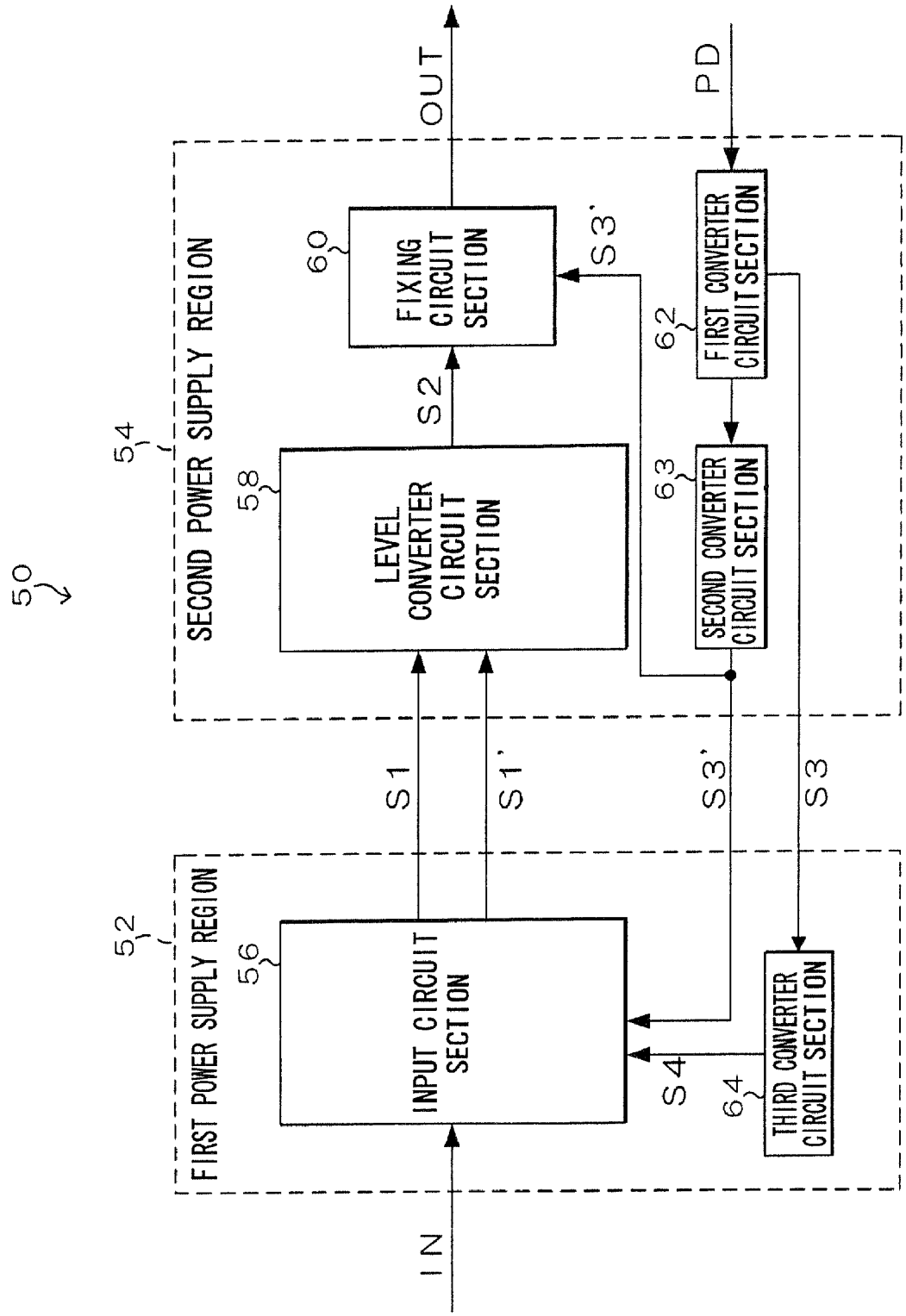
FIG. 3 is a functional block diagram functionally showing the configurations of the level shift circuits of each of the embodiments.
Figure 4:
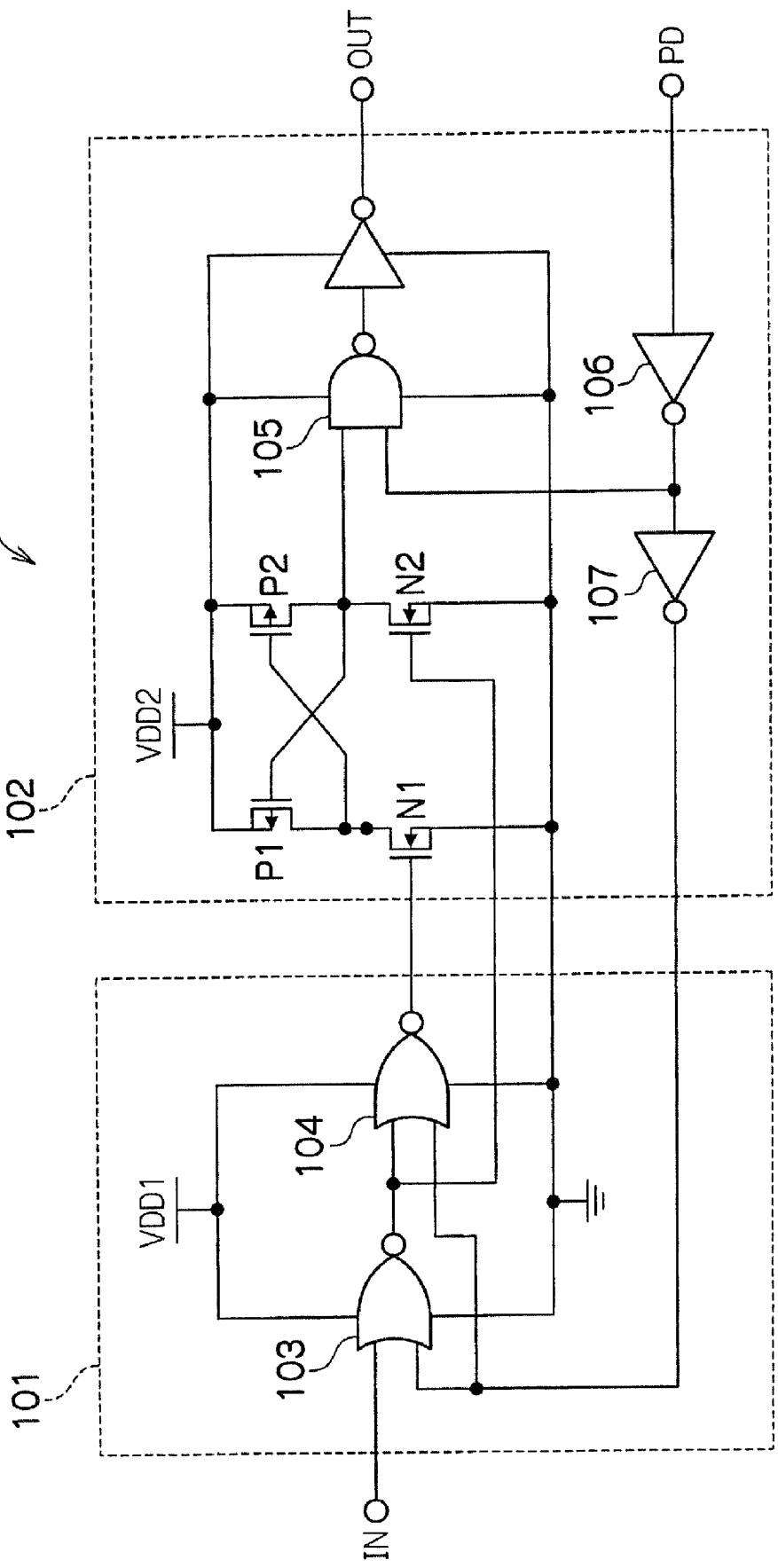
FIG. 4 is a diagram showing the configuration of an example of a conventional level shift circuit.

For example, in FIG. 3, there is shown a functional block diagram functionally showing the configurations of the level shift circuits (see FIG. 1 and FIG. 2) of each of the embodiments. As shown in FIG. 3, a level shift section 50 is configured to include a first power supply region 52 that is driven by a first power supply voltage VDD1 and a second power supply region 54 that is driven by a second power supply voltage VDD2. The first power supply region 52 and the second power supply region 54 are electrically interconnected. Moreover, the first power supply region 52 is connected to a first control section (not shown), and the second power supply region 54 is connected to a second control section (not shown) and a load (not shown).

Further, a control signal IN is inputted from the first control section to the first power supply region 52. Moreover, a control signal PD is inputted from the second control section to the second power supply region 54. That is, the operating states (also including the supply states of the power supplies) of the first power supply region 52 and the second power supply region 54 are controlled by different control sections.

The first power supply region 52 is configured to include an input circuit section 56, and the control signal IN is inputted thereto. The input circuit section 56 generates a signal S1 and a signal S1' and outputs these signals to the second power supply region 54. It will be noted that the input circuit section 56 corresponds to a generator circuit section.

Further, the second power supply region 54 is configured to include a level converter circuit section 58, a fixing circuit section 60, a first converter circuit section 62 and a second converter circuit section 63. The level converter circuit section 58 outputs a converted signal S2 that corresponds to the signal S1 and the signal S1' that have been outputted from the first power supply region 52.

Further, the control signal PD that is inputted to the second power supply region 54 is a control signal that represents the supply state of the power supply to the second power supply region 54. The control signal PD is converted via the first converter circuit section 62 and is outputted to the second converter circuit section 63 as a converted signal S3. The second converter circuit section 63 outputs, to the fixing circuit section 60 and the input circuit section 56 of the first power supply region 52, a signal S3' (a control signal PD) which is obtained by converting the signal S3, the conversion thereof being opposite to the conversion of the first converter circuit section 62.

In the fixing circuit section 60, when a signal representing supply of the power supply has been inputted as the control signal PD such that the second power supply region 54 operates in response to the control signal PD, the fixing circuit section 60 uses a signal corresponding to the converted signal S2 as an output signal to the load. On the other hand, when a signal representing cut off of the supply of the power supply has been inputted, the fixing circuit section 60 fixes the output signal to the load.

Here, the first power supply region 52 is configured to include a third converter circuit section 64. The converted signal S3 of the first converter circuit section 62 of the second power supply region 54 is inputted to the third converter circuit section 64. The third converter circuit section 64 performs conversion of the signal S3, the conversion thereof being opposite to the conversion of the first converter circuit section 62, and outputs the converted signal to the input circuit section 56 as a signal S4.

Because the level shift section 50 is configured in this manner, the input circuit section 56 generates and outputs the signal S1 and the signal S1' on the basis of the control signal IN, the signal S3' and the signal S4.

Below, the action resulting from the functions shown in FIG. 3 will be described.

First, when at least the power supply to the second power supply region 54 is being performed, the converted signals S4 and S3' that are inputted to the input circuit section 56 becomes the same signal. Consequently, as long as the power supply is being supplied to the second power supply region 54, a through current path in the first power supply region 52 and the second power supply region 54 can be cut off regardless to the state of the power supply (supply or cut off) to the first power supply region 52.

On the other hand, when the power supply to the second power supply region 54 is cut off and the power supply to the first power supply region 52 is being supplied, the voltage levels of lines that output signals with respect to the first power supply region 52 from the second power supply region 54 becomes the same, and the same signal is inputted as the converted signal S3 and the signal S3'. However, because the converted signal S3 is converted by the third converter circuit section 64, the signal S4 that is outputted from the third converter circuit section 64 becomes a signal opposite to the signal S3'. As a result, one of the signal S4 and the signal S3' that are inputted to the input circuit section 56 becomes output when the control signal PD represents power supply cutoff. Consequently, when supply of the power supply to the second power supply region 54 is cut off and the power supply is being supplied to the first power supply region 52, a through current path in the first power supply region 52 and the second power supply region 54 can be cut off regardless of the value of the control signal IN.

It will be noted that it is also possible to further connect an auxiliary fixing circuit section that corresponds to the NMOS transistor N7, that has been described in the second embodiment, to the output end of the fixing circuit section 60 of the configuration shown in FIG. 3 and to connect the output end of the third converter circuit section 64 to the input end of the sub-fixing circuit section.

Thus, even when the power supply to the first power supply region 52 is cut off, the output terminal OUT can be fixed to an L level.

What is claimed is:

1. A level shift circuit comprising:
    an input circuit section that operates by the supply of electrical power from a first power supply voltage;
    an output circuit section, electrically connected to the input circuit section, that operates by the supply of electrical power from a second power supply voltage different from the first power supply voltage;
    a level converter circuit, disposed in the output circuit section, including an N-channel first transistor and an N-channel second transistor having grounded sources; a P-channel third transistor having a source connected to a power supply line of the second power supply voltage, a drain connected to the drain of the first transistor, and a gate connected to the drain of the second transistor; and a fourth transistor having a source connected to a power supply line of the second power supply voltage, a drain connected to the drain of the second transistor, and a gate connected to the drain of the first transistor;
    a first converter circuit that operates by the supply of electrical power from the second power supply voltage and converts and outputs a power supply cut off control signal inputted from the outside of the output circuit section;
    a second converter circuit that operates by the supply of electrical power from the second power supply voltage and converts and outputs a signal inputted from the first converter circuit;
    a third converter circuit that operates by the supply of electrical power from the first power supply voltage and converts and outputs a signal inputted from the first converter circuit;
    a fixing circuit, disposed in the output circuit section, that fixes a signal level to be outputted from the output circuit section, based on the output from the level converter circuit and a control signal outputted from the second converter circuit;
    a first generator circuit, disposed in the input circuit section, that generates a control signal to be outputted to the gate of the first transistor, based on an input signal inputted from outside of the input circuit section, the signal outputted from the second converter circuit and the signal outputted from the third converter circuit; and
    a second generator circuit, disposed in the input circuit section, that generates a control signal to be outputted to the gate of the second transistor, based on the signal generated by the first generator circuit, the signal outputted from the second converter circuit and the signal outputted from the third converter circuit.

2. The level shift circuit of claim 1, wherein the output of the third converter circuit is further inputted to the fixing circuit, and the fixing circuit fixes the signal level outputted from the output circuit section, based on the output resulting from the level converter circuit, the output resulting from the second converter circuit and the output resulting from the third converter circuit.

3. The level shift circuit of claim 1, further comprising an N-channel fifth transistor having a drain connected to the output of the fixing circuit, a grounded source and a gate connected to the output of the third converter circuit.

4. A level shift circuit comprising:
    a first power supply region including a plurality of circuit sections that operate by the supply of electrical power having a first power supply voltage;
    a second power supply region including a circuit section electrically connected to the circuit sections disposed in the first power supply region, wherein the second power supply region operates by the supply of electrical power having a second power supply voltage different from the first power supply voltage;
    a first converter circuit section, disposed in the second power supply region, that performs a predetermined conversion on a power supply cut off control signal inputted from the outside of the level shift circuit, and outputs the converted signal;
    a second converter circuit section, disposed in the second power supply region, that performs conversion on a signal outputted by the first converter section, and outputs the converted signal, the conversion thereof being opposite to the conversion of the first converter circuit section;
    a third converter circuit section, disposed in the first power supply region, that performs conversion on a signal outputted by the first converter section, and outputs the converted signal, the conversion thereof being opposite to the conversion of the first converter circuit section;
    a level converter circuit section, disposed in the second power supply region, that performs level conversion in response to a signal inputted via the first power supply region;
    a generator circuit section, disposed in the first power supply region, that generates a signal to be outputted to the level converter circuit section, based on an input signal inputted from the outside of the level shift circuit, the signal outputted from the second converter circuit section and the signal outputted from the third converter circuit section; and
    a fixing circuit section, disposed in the second power supply region, that fixes the output resulting from the level converter circuit section, based on the signal outputted from the second converter circuit section.

5. The level shift circuit of claim 4, further comprising an auxiliary fixing circuit section that further fixes the output resulting from the fixing circuit section, based on the signal outputted from the third converter circuit section.

* * * * *